United States Patent
Levy et al.

(10) Patent No.: US 12,326,847 B2
(45) Date of Patent: Jun. 10, 2025

(54) COMPRESSION OF CELLS OF A TABULAR DATABASE

(71) Applicant: VAST DATA LTD., Tel Aviv (IL)

(72) Inventors: Asaf Levy, Tel Aviv (IL); Eyal Gordon, Tel Aviv (IL)

(73) Assignee: VAST DATA LTD., Tel Aviv (IL)

( * ) Notice: Subject to any disclaimer, the term of this patent is extended or adjusted under 35 U.S.C. 154(b) by 206 days.

(21) Appl. No.: 17/877,949

(22) Filed: Jul. 31, 2022

(65) Prior Publication Data
US 2024/0037083 A1   Feb. 1, 2024

(51) Int. Cl.
*G06F 16/22* (2019.01)
*G06F 16/23* (2019.01)

(52) U.S. Cl.
CPC ...... *G06F 16/2282* (2019.01); *G06F 16/2365* (2019.01)

(58) Field of Classification Search
CPC .......................... G06F 16/2282; G06F 16/2365
See application file for complete search history.

(56) References Cited

U.S. PATENT DOCUMENTS

| | | | |
|---|---|---|---|
| 11,894,117 B1* | 2/2024 | McNair | G16H 10/60 |
| 2010/0281079 A1* | 11/2010 | Marwah | H03M 7/30 |
| | | | 707/812 |
| 2014/0195500 A1* | 7/2014 | Amit | G06F 16/2365 |
| | | | 707/693 |
| 2015/0363456 A1* | 12/2015 | Raman | G06F 16/282 |
| | | | 707/693 |
| 2020/0233706 A1* | 7/2020 | Smith | G06F 9/5066 |
| 2022/0075843 A1* | 3/2022 | Kumar | G06F 40/284 |
| 2023/0289252 A1* | 9/2023 | Settle | G06F 11/0793 |

* cited by examiner

*Primary Examiner* — Jensen Hu
(74) *Attorney, Agent, or Firm* — Reches Patents (57) ABSTRACT

A method for compression of cells of a tabular database (TD), the method may include (i) receiving data elements, by a storage system; (ii) calculating a compressed representation (CR) of the data elements by applying a compression process that includes (ii.a) defining sets based on data element values, (ii.b) associating a set value per set; and (ii.c) generating the CR of the data elements based on differences between the data elements and corresponding set values; (iii) generating compression metadata related to the CR of the data elements, wherein the compression metadata comprises the set values and a mapping between the CR of the data elements and the set values; and (iv) storing, in the TD, the CR of the data elements.

24 Claims, 6 Drawing Sheets

COMPRESSION OF CELLS OF A TABULAR DATABASE

TECHNICAL FIELD

The present disclosure generally relates to the field of data storage, and more particularly to compression of cells of a tabular database.

BACKGROUND

A table is a database object which is comprised of rows and columns, that store a collection of related data. Each column stores data related to a specific type of content, and each row stores a record with all the details related to a specific entity. Each cell is formed by the intersection of a column and row.

SUMMARY

There may be provide a storage system, a method and a non-transitory computer readable medium for compression of cells of a tabular database.

BRIEF DESCRIPTION OF THE DRAWINGS

The subject matter disclosed herein is particularly pointed out and distinctly claimed in the claims at the conclusion of the specification.

The foregoing and other objects, features, and advantages of the disclosed embodiments will be apparent from the following detailed description taken in conjunction with the accompanying drawings.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a device or system capable of executing the method and/or to a non-transitory computer readable medium that stores instructions for executing the method.

Any reference in the specification to a system or device should be applied mutatis mutandis to a method that may be executed by the system, and/or may be applied mutatis mutandis to non-transitory computer readable medium that stores instructions executable by the system.

Any reference in the specification to a non-transitory computer readable medium should be applied mutatis mutandis to a device or system capable of executing instructions stored in the non-transitory computer readable medium and/or may be applied mutatis mutandis to a method for executing the instructions.

Any combination of any module or unit listed in any of the figures, any part of the specification and/or any claims may be provided.

The specification and/or drawings may refer to a compute core. The compute core can be a processing circuitry, a part of processing circuitry, a virtual machine core, and the like. The processing circuitry may be implemented as a central processing unit (CPU), a graphic processing circuitry (GPU), and/or one or more other integrated circuits such as application-specific integrated circuits (ASICs), field programmable gate arrays (FPGAs), full-custom integrated circuits, etc., or a combination of such integrated circuits.

Any combination of any steps of any method illustrated in the specification and/or drawings may be provided.

Any combination of any subject matter of any of claims may be provided.

Any combinations of systems, units, components, processors, sensors, illustrated in the application may be provided.

There are provided storage systems, methods, and non-transitory computer readable media for compressing cells in a tabular database.

A group of cells of a tabular database are stored using a compact presentation of the cells' values. A set of base values are selected and employed for each group of cells in a tabular database for allowing representing the values of the group of cells, using less storage space. Each value in the group of cells is stored as a delta value, which is the calculated difference between the original value of the cell and the corresponding base value selected for the cell from the set of base values of the group of cells. Since the delta value is smaller than the original value, less storage space (number of bits) is needed for storing a delta value.

The group of cells includes multiple cells and may be a portion of a column of the table, wherein the column includes multiple groups of cells. Each group of cells is associated with a set of base values, which may be created based on the original values to be represented by the cells of the group and the amount of storage consumed by the group of cells when using the set of base values.

Figure 1A:
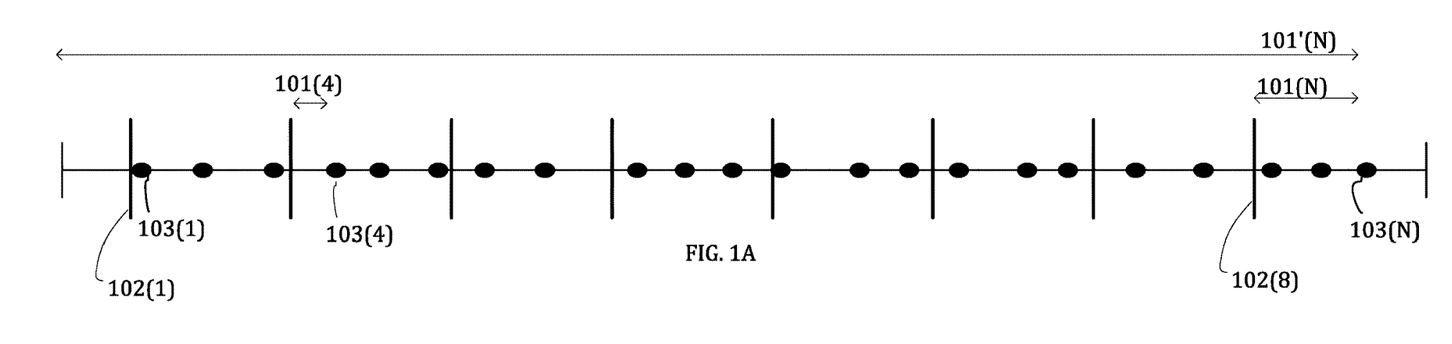
FIG. 1A is an example of a values.

FIG. 1A illustrates unique values 103(1)-103(N) of a group of values related to a group of cells. FIG. 1 further illustrates eight base values 102(1)-102(8) that may be selected for the group of cells. Instead of storing the original value received from a user of the storage system, the value stored is the difference between the original value and the closest base value. For example, instead of storing the original value 103(N), the value stored is a delta value, which is the difference 101(N) between the original value and the closest base value 102(8). The storage space required for storing the delta value can be much more compact than the original value. Suppose the minimal value possible for the corresponding column is zero, then the original value 103(N) would need to capture enough bits for covering the delta 101'(N). Much smaller number of bits is required for storing the difference 101(N) than the difference 101'(N).

The storage space that is spared for the group of cells, when storing only delta values, can be determined by the sum of the storage consumed by the delta values stored in the group of cells, versus the sum of the storage that would be consumed by the original values related to the group of cells. However, using a set of base values required for calculating delta values and for reconstructing the original values needed for responding to user queries, consumes extra storage space required for referring to a corresponding base value by each cell that stores a delta value, in addition to the storage space consumed by the base values themselves. The extra consumed storage space depends on the number of base values. For example, if eight base values are used, each cell will require to store metadata of three extra bits for referring to the corresponding base value, where the referring metadata has a value between 0-7. If each base value occupies, for example, eight bytes, then an extra of 64 bytes are required for storing the base values of the group of cells.

If the storage that is spared by the compact presentation of the delta values of the group (compared to a full presentation of the original values) is higher than the amount of storage needed to store the base values per group of cells plus a referring metadata per cell—than it might be worthful to implement the storage of the group of cells by using the base values.

Figure 1B:
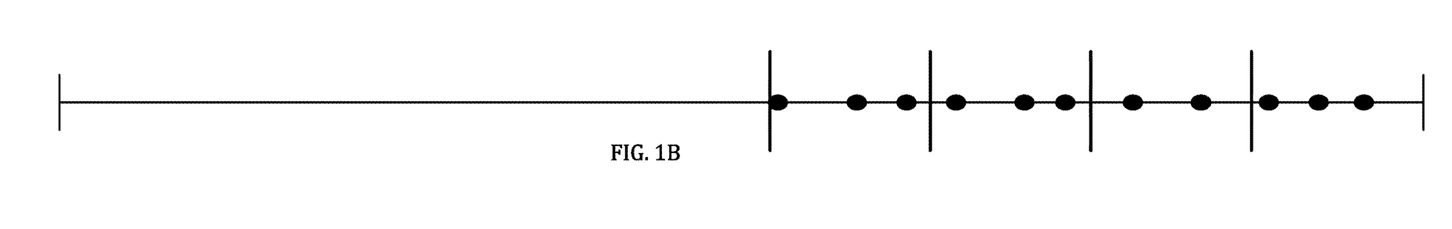
FIG. 1B is an example of a values.
Figure 1C:
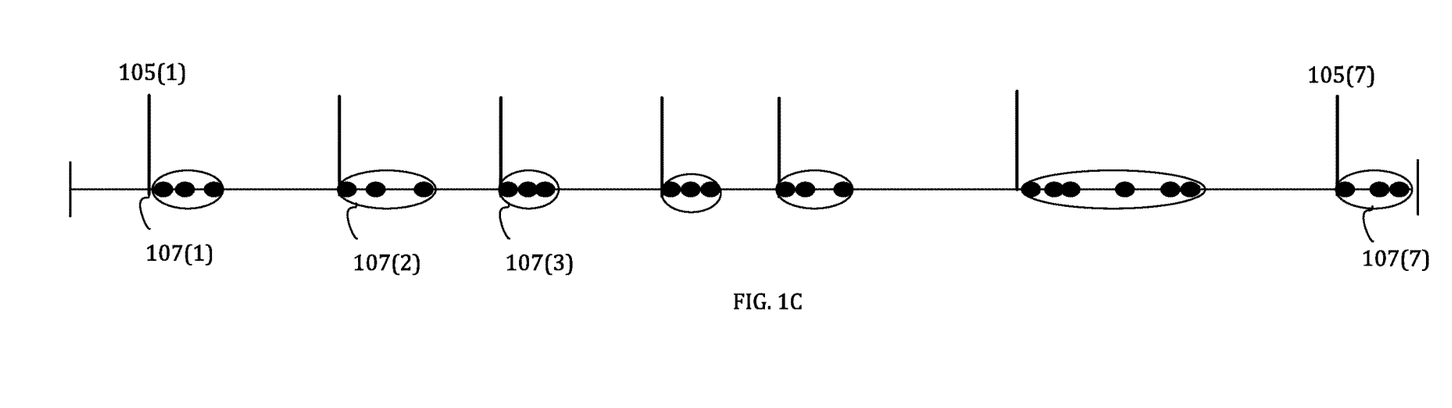

FIG. 1A illustrates the base values as being arbitrarily spread across the value range. FIGS. 1B and 1C illustrate base values that are adapted to the specific original values. For example, when the range of the original values is limited to a certain sub-range, for example a sub-range that includes the higher values of the potential value range of a column, as in FIG. 1B, the base values can be set according to the borders of the sub-range.

FIG. 1C illustrates an embodiment of the invention, where in order to create a set of base values for a group of original values, the original values of the group are clustered into sub-groups of original values. FIG. 1C illustrates original values that are clustered into seven sub-groups of original values 107(1)-107(7). The base values 105(1)-105(7) may be selected as the minimum values of each sub-groups of original values. Clustering the original values to obtain the minimum values of each sub-group, that serve as the base values, may result in even smaller delta values that occupy less storage space, comparing to the example of FIG. 1A. Any other value other than the minimum may be selected as the base value of the sub-group, for example, an average of the values of the sub-group, a median, or any other value within the range of the sub-group, or in the vicinity of the range of the values of the sub-group, for example, in the lower margin or the upper margin outside the range of values.

The sub-groups of original values may be created by: (i) sorting the original values and calculating the size of the gaps between unique original values (differences between two consecutive unique values), and (ii) selecting the top K ranking gaps, based on size characteristics of the gaps. The top-ranking gaps separate the sub-groups from each other. The gaps may be also selected based on quantity characteristics of the values that are separated by the gaps, e.g., small sub-groups with only few values may be joint to neighbor sub-groups.

Top ranking gaps may be for example, the largest gaps. The top-ranking gaps may further be gaps that are substantially larger than an average gap between two unique values, e.g., larger by at least a factor (twice, 10 times, etc.) than the average gap. A gap may be omitted from the top-ranking gaps, if it separates only a single value or a small number of values from another sub-group of values.

Each sub-group of original values includes values that are separated by the selected top-ranking gaps. The lowest value in the sub-group of original values may serve as the base value for the sub-group of cells that corresponds to the sub-group of original values.

Figure 2A:
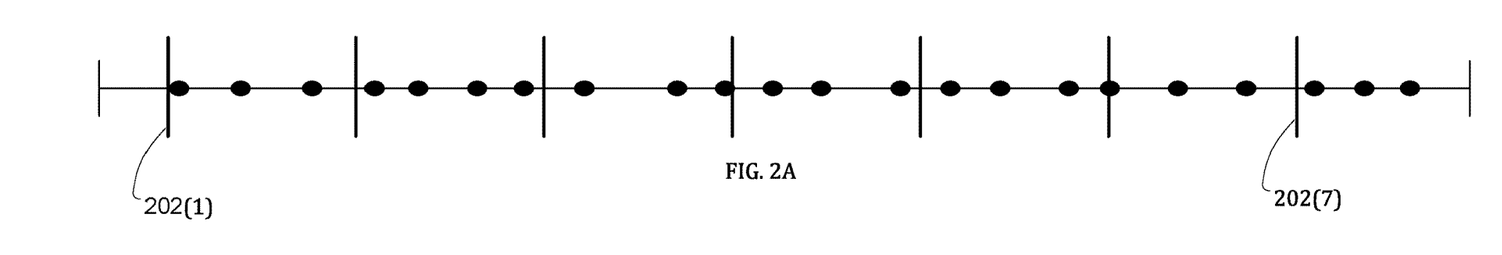
FIG. 2A is an example of a values.
Figure 2B:
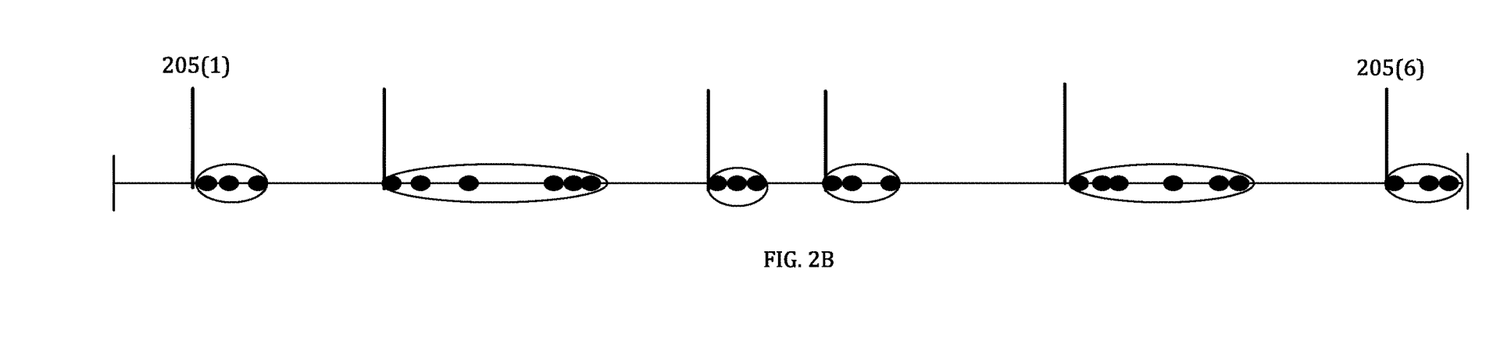
FIG. 2B is an example of a values.

Several configurations of the set of base values can be evaluated, and the one that causes the group of cells, including the additional metadata, to occupy the lowest amount of storage space— is selected. Each evaluated configuration may include a different number of base values in the set, and/or may include different values for the base values in the set. For example, while FIG. 1A illustrates eight base values 102 that are distributed evenly across the value range, FIG. 2A illustrates a different configuration of seven base values 202(1)-202(7) that are distributed evenly across the value range, and therefore have different values from the base values 102 (as well as different number in the set). As for another example, FIG. 1C illustrates seven sub-groups of original values with seven base values 105 derived from the minimum values of the sub-groups, FIG. 2B illustrates six sub-groups of values with six base values 205(1)-205(6) derived from the minimum values of the sub-groups. In the latter example, one base value was omitted, because sub-groups 107(2) and 107(3) have been joint to one sub-group, but the other base values have not changed.

An iterative algorithm may evaluate different sets (configurations) of base values. At each iteration of the algorithm, calculations are made for the storage consumed by the group of cells when using a different set of base values, and compared to the storage that would have consumed by the group of cell when storing the original values, and further compared to the storage consumed by the group of cells when using other sets of base values that were checked during previous iterations.

The storage consumed by the original values is the sum, across the cells in the group of cells, of the amount of storage space (number of bits) required to store the original value of each cell. The calculation of the storage consumed by the group of cells when using a specific set of base values includes summing the three components: (i) the sum across the cells in the group of cells, of the amount of storage space (number of bits) required to store the delta value of each cell, where the delta value is calculated, for example, by: the most suitable base value (closest from below the original value) subtracted (or omitted) from the original value; (ii) the amount of space required for storing metadata for referring to the corresponding base value of each cell. The number of base values dictates the size of this referring metadata, which is then multiplied by the number of cells in the group; and (iii) the storage required for storing the set of base values.

Figure 3:
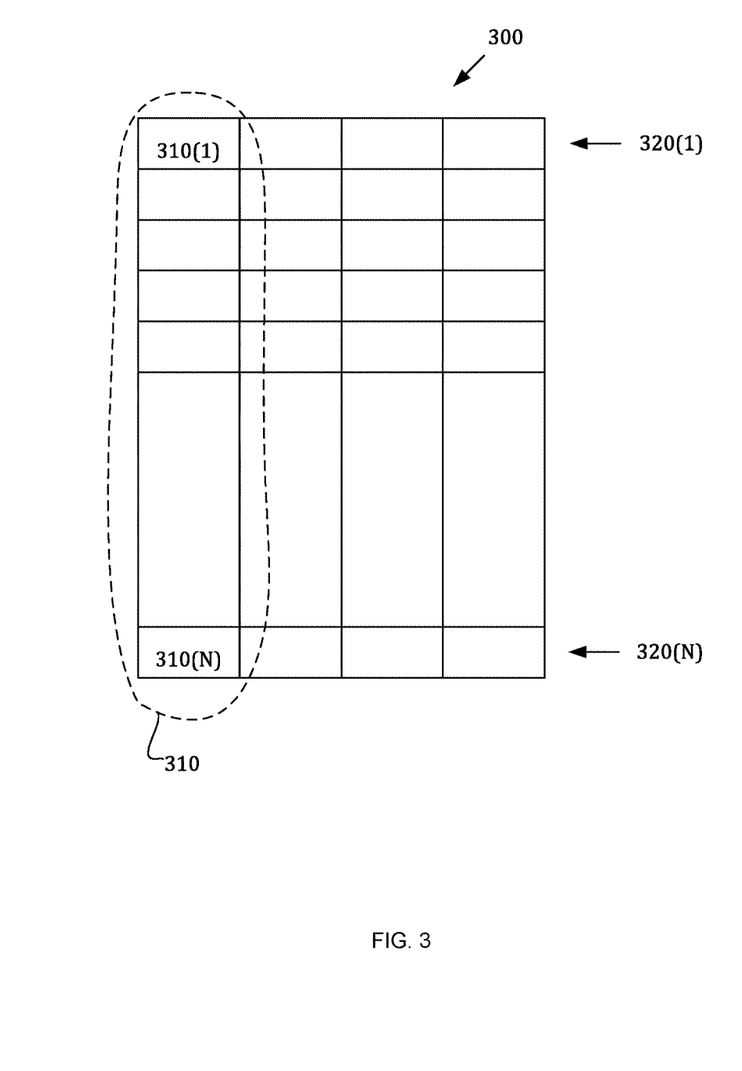
FIG. 3 is an example of a batch of data.

FIG. 3 illustrates a batch of data 300 that is received by a storage system as part of a request of a user to add the batch to a tabular database. The batch of data includes N rows 320(1)-320(N) that are to be appended to the tabular database as a sequence of rows. The illustrated batch includes four columns. The batch may be stored in a temporary storage space of the storage system, and the creation of the sets of base values for one or more groups of cells of one or more columns of the batch may be performed before the batch is appended to the table.

A group of cells 310 includes N cells 310(1)-310(N) with original values as received from a user of the storage system that requested to upload the batch to a DB table.

Figure 4:
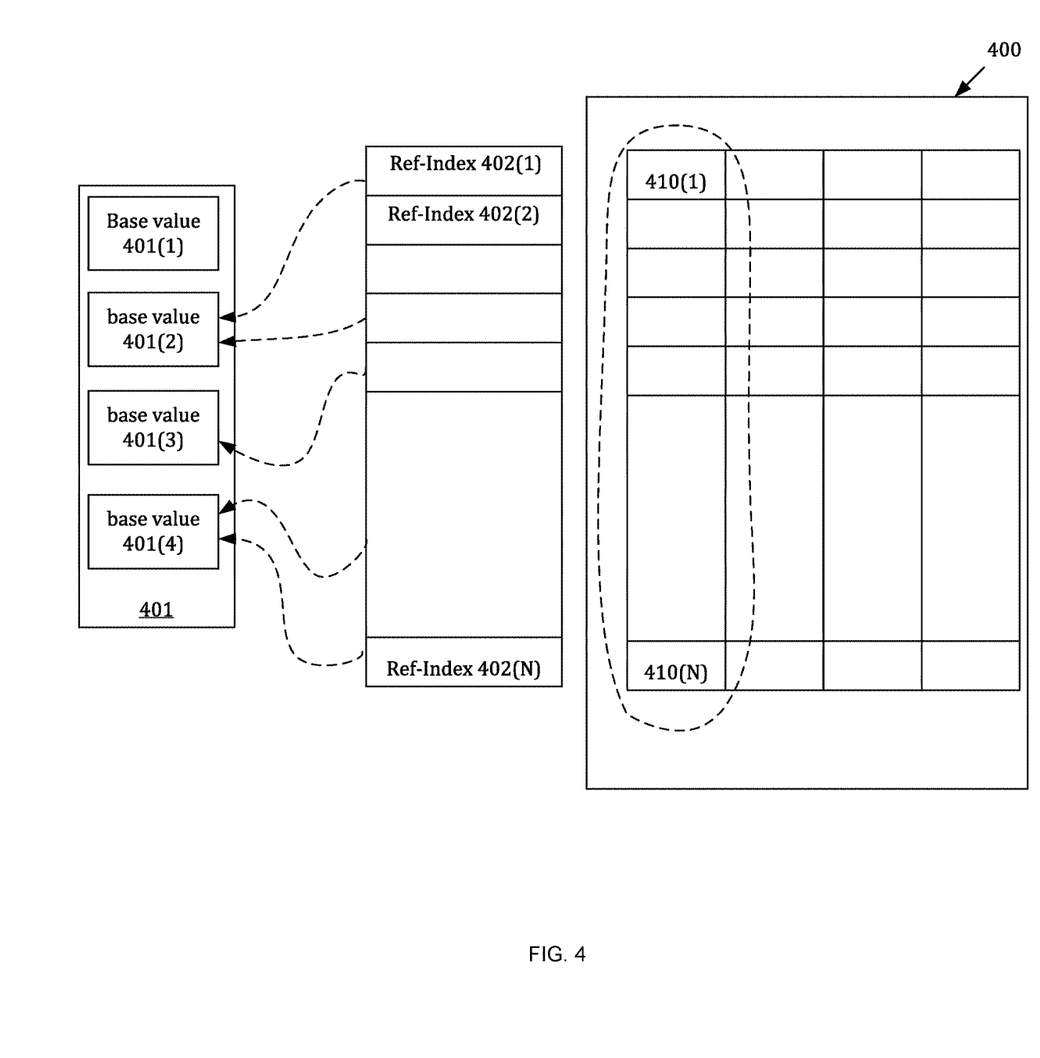
FIG. 4 is an example of the batch of data after being uploaded to a DB table.

FIG. 4 illustrates the batch after being uploaded to the requested TD 400, where the group of cells 310 of the batch is now part of TD 400, as cells 410(1)-410(N) that includes delta values instead of the original values.

A set of base values 401 is created for the group of original values stored in cells 310 of the batch and includes, in this example, a set of four base values 401(1)-401(4).

Each cell is being associated with one base value, and assigned an index metadata for referring to the base value. For example, each cell 410(1)-410(N) is assigned with a corresponding referring index 402(1)-402(N) referring to the base value that is associated with the cell, such as cell 410(1) that is assigned with a referring index 402(1) that points to base value 401(2), and cell 410(N) is assigned with an index 402(N) that points to base value 401(4). In this example, since there are four base values, each instance of index 402 that points to a base value occupies 2 bits (with the combinations: 00, 01, 10, and 11, corresponding to the 1-4 base values). Cell 410(1)-410(N) includes delta values. For example, cell 410(1) include the value of cell 310(1) (the original value) minus base value 401(2).

When a query is received by the storage system from an external entity that accesses the database, wherein the query addresses a column that includes one or more groups of cells, wherein at least one group of cells is associated with a set of base values, then—each value retrieved from a cell of the least one group of cells is considered as a delta value, where the original value of the cell is provided by adding the delta value to a corresponding base value, that is retrieved with the aid of the referring metadata associated with the cell and referring to the base value of the cell.

Figure 5:
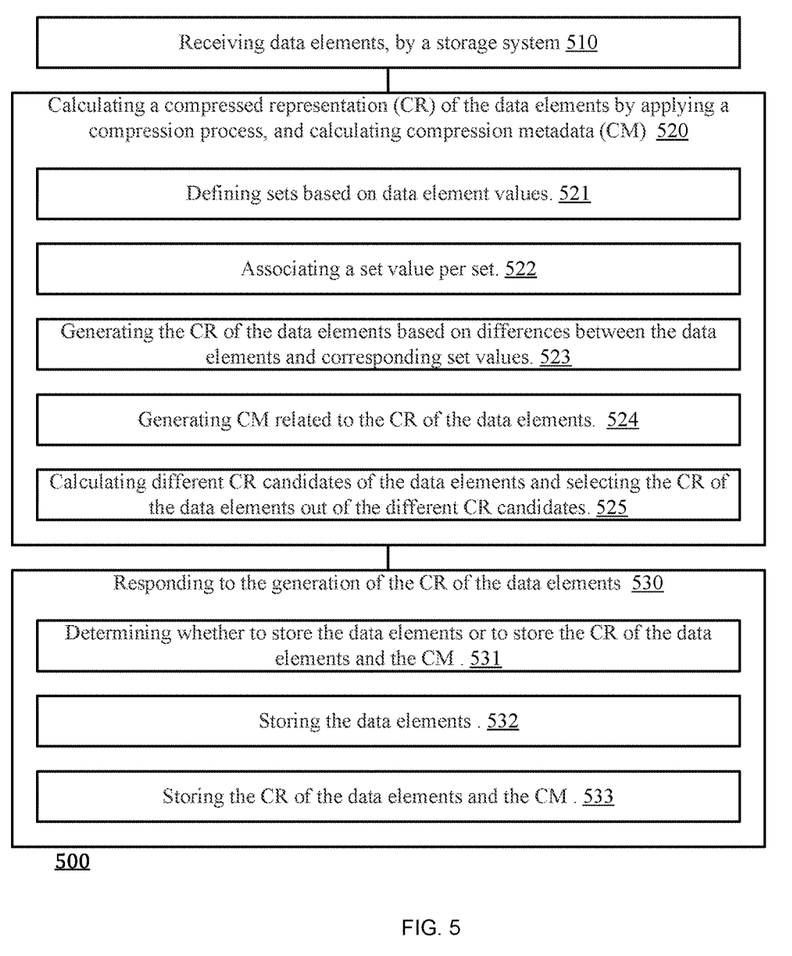
FIG. 5 is an example of a method.

FIG. 5 illustrates an example of method 500 for compression of cells of a tabular database (TD).

Method 500 may start by step 510 of receiving data elements, by a storage system. The data elements may form a data batch or part of a data batch, such as cells 310(1)-310(N) of batch 300.

Step 510 may be followed by step 520 of calculating a compressed representation (CR) of the data elements by applying a compression process.

Step 520 may include a sequence of steps 521, 522 and 523. Step 521 may include defining sets based on data element values. The sets may be the sub-groups 107(1)-107(7) of FIG. 1C.

Step 521 may include sorting the data element values to provide sorted values, and dividing the sorted values to provide the sets. This may include determining sorted value gaps (gaps between sorted values) between consecutive sorted values, defining a predefined number of largest sorted gaps as inter-set gaps that separate between the sets.

Step 522 may include associating a set value per set. A set value is used to compress the data element values of the set. The data elements values may be associated with multiple set values, according to the number of sets. The set values may be the base values 401(1)-401(4) of FIG. 4.

Step 523 may include generating the CR of the data elements based on differences between the data elements and corresponding set values.

Step 520 may also include step 524 of generating compression metadata related to the CR of the data elements, wherein the compression metadata comprises the set values and a mapping between the CR of the data elements and the set values. Each CR of a data element is associated with a mapping that maps the CR of a data element to one of the set values, such as index 402(1) associated with cell 410(1) and points to base value 401(2).

Step 520 may include step 525 calculating different CR candidates of the data elements and selecting the CR of the data elements out of the different CR candidates. This may include repeating at least some of steps 521, 522 and 523 multiple times.

At least two of the different CR candidates differ from each other by a set generation parameter defining a manner in which the sets are defined. Additionally or alternatively, more than one different CR candidates differ from each other by a set value calculation parameter defining a manner in which the set values are calculated.

The set value calculation parameter may define a set value of a set as an average of values of the set, or as a centroid of a cluster formed by the set, or as a median value of the set, or as a minimum value of the set. Other definitions of the set values may be provided.

Step 520 may be followed by step 530 of responding to the generation of the CR of the data elements.

Step 530 may include step 531 of determining whether to store the data elements (the original values) or to store the CR of the data elements and the compression metadata related to the CR of the data elements.

Step 530 may include step 532 of storing the data elements— when determining (in step 531) to store the data elements and not the CR of the data elements and the compression metadata related to the CR of the data elements.

Step 530 may include step 533 of storing, in the TD, the CR of the data elements and the compression metadata related to the CR of the data elements. The CR of the data elements may be stored as part of a column of the TD. The compression metadata may be stored as part of the metadata of the TD in association with the part of a column of the TD. Step 533 may be unconditional—when there is no step 531—or when step 531 determines to store the CR of the data elements and the compression metadata related to the CR of the data elements.

The CR of the data elements, once stored, may be accessed and/or decompressed for various reasons—for example to response to an access request.

Step 531 may include comparing a storage effectiveness of a storage the data elements to a storage effectiveness of the CR of the data elements and the compression metadata related to the CR of the data elements. The storage effectiveness may take into account the size difference between the data elements and a combination of the CR of the data elements and the compression metadata related to the CR of the data elements. The storage effectiveness may also take into account additional latency and/or resources related to the compression of the data elements and/or decompression of the CR of the data elements. The more effective option is selected.

The method may be executed in real time—for example tens and/or hundreds and/or thousand and/or hundred thousands and/or millions times a second.

Figure 6:
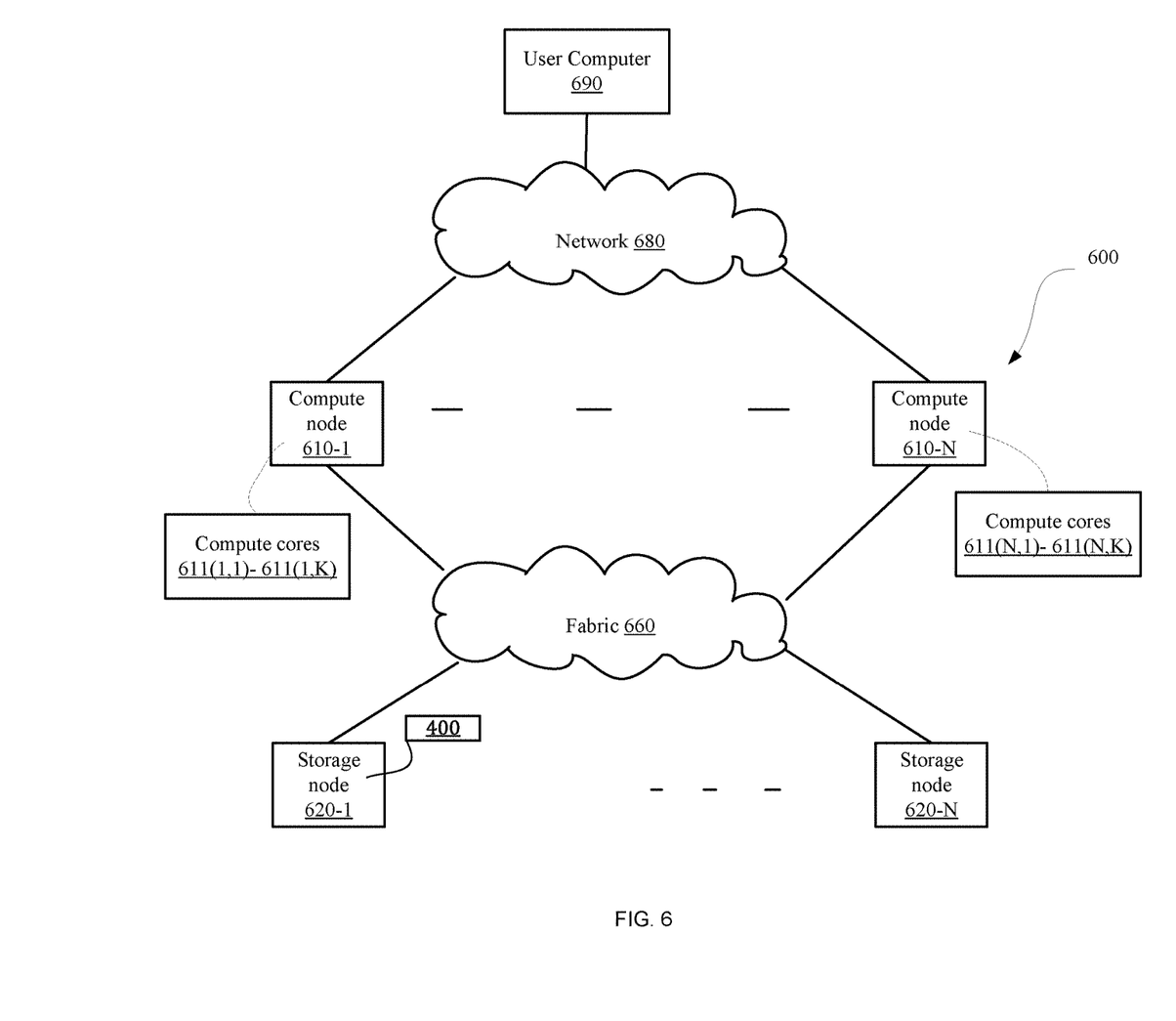
FIG. 6 is an example of a storage system and its environment.

FIG. 6 shows an example diagram of a storage system 600, user computer 690 and an example of an implementation of method 500, according to the disclosed embodiments.

The storage system 600 includes a number of N compute nodes 610-1 through 610-N (hereinafter referred to individually as a compute node 610 and collectively as compute nodes 610, merely for simplicity purposes, N is an integer equal to or greater than 1). The compute nodes include (or may execute) multiple compute cores each (for example 611(1,1)-611(l,K) of compute node 610-1 and 611(N,l)-611(N,K) of compute node 610-N). The compute nodes are configured to receive batches of data to be stored in a TD and to execute method 500.

The storage system 600 also includes a number of M storage nodes 620-1 through 620-M (hereinafter referred to individually as a storage node 620 and collectively as storage nodes 620, merely for simplicity purposes, M is an integer equal to or greater than 1). The computer nodes 610 and the storage nodes 620 are connected through a communication fabric 660. M may equal N or may differ from N. Storage node 620-1 is illustrated as storing TD 400. The storage nodes may store multiple TDs, the TD may be stored in multiple storage nodes. The compute nodes may access the storage nodes via the communication fabric for storing the selected CR of the data elements.

In an embodiment, a compute node 610 may be realized as a physical machine or a virtual machine. A physical machine may include a computer, a sever, and the like. A virtual machine may include any virtualized computing instance (executed over a computing hardware), such as a virtual machine, a software container, and the like.

It should be noted that in both configurations (physical or virtual), the compute node 610 does not require any dedicated hardware.

In an embodiment, each compute node 610 may interface one or more user devices (such as user device 190). A user device may host one or more users. The compute nodes may receive from the users (via the user devices users) data or batches of data to be stored in the TD and queries addressed to the TD for reading content of the TD. The compute nodes interface the clients via one or more networks, such as network 180. The network may be, but is not limited to, the Internet, the world-wide-web (WWW), a local area network (LAN), a wide area network (WAN), and the like. The response to the query may be sent via the interface.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Any reference to "consisting", "having" and/or "including" should be applied mutatis mutandis to "consisting" and/or "consisting essentially of".

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

It is appreciated that various features of the embodiments of the disclosure which are, for clarity, described in the contexts of separate embodiments may also be provided in combination in a single embodiment. Conversely, various features of the embodiments of the disclosure which are, for brevity, described in the context of a single embodiment may also be provided separately or in any suitable sub-combination.

It will be appreciated by persons skilled in the art that the embodiments of the disclosure are not limited by what has been particularly shown and described hereinabove. Rather the scope of the embodiments of the disclosure is defined by the appended claims and equivalents thereof.

What is claimed is:

1. A method for compression of cells of a tabular database (TD), the method comprises:
receiving data elements, by a storage system;
compressing, by a computer core, the data elements to provide a compressed representation (CR) of the data elements by applying a compression process that comprises:
clustering values of the data elements into multiple sets;
associating a set value per each set of the multiple sets, based on values clustered into the set, to provide multiple set values;
selecting, for each data element, a selected set value, that is closest to a value of the data element, among the multiple set values; and
generating, for each data element, the CR of the data element, based on a difference between the data element and the selected set value;
generating compression metadata related to the CR of the data elements, wherein the compression metadata comprises the multiple set values and a mapping between the CR of each data element and the selected set value of the data element;
wherein the compressing further comprising:
evaluating multiple configurations, wherein each evaluated configuration of the multiple configurations includes evaluated multiple set values, wherein different evaluated multiple set values include different numbers of set values; wherein the evaluating includes calculating an estimated storage consumption of the data elements when applying each of the multiple configurations, wherein the estimated storage consumption includes: (i) an aggregated storage size consumed by mappings related to all CRs of the data elements, wherein a storage size consumed by each mapping depends on a number of set values of the evaluated configuration; (ii) a size of the evaluated multiple set values; and (iii) a total size of the CR of the data elements when applying the evaluated multiple set values;
and
storing, in the TD, the CR of the data elements;
wherein the compute core comprises a processing circuit that comprises an integrated circuit.

2. The method according to claim 1, wherein the compressing comprises calculating different CR candidates of the data elements and selecting the CR of the data elements out of the different CR candidates.

3. The method according to claim 2, wherein at least two of the different CR candidates differ from each other by a set generation parameter defining a manner in which the multiple sets are defined.

4. The method according to claim 2, wherein at least two of the different CR candidates differ from each other by a set value calculation parameter defining a manner in which the multiple set values are calculated.

5. The method according to claim 2, wherein the set value calculation parameter defines a set value of a set as an average of values of the set.

6. The method according to claim 2, wherein the set value calculation parameter defines a set value of a set that is a cluster as a centroid of the cluster.

7. The method according to claim 1 comprising comparing a storage effectiveness of a storage of the data elements to a storage effectiveness of the CR of the data elements and the compression metadata, and storing one out of the (a) data elements, or (b) the CR of the data elements and the compression metadata, wherein the storing is based on an outcome of the comparing.

8. The method according to claim 7 wherein the comparing takes into account a size difference between the data elements and a combination of the CR of the data elements and the compression metadata related to the CR of the data elements.

9. The method according to claim 1 wherein the clustering comprises sorting the data element values to provide sorted values, and dividing the sorted values to provide the multiple sets.

10. The method according to claim 9 wherein the clustering comprises determining sorted value gaps between consecutive sorted values, defining a predefined number of largest sorted gaps as inter-set gaps that separate between the multiple sets.

11. A non-transitory computer readable medium for compression of cells of a tabular database (TD), the non-transitory computer readable medium stores instructions for:
receiving data elements, by a storage system;
compressing, by a computer core, the data elements to provide a compressed representation (CR) of the data elements by applying a compression process that comprises:
clustering values of the data elements into multiple sets;
associating a set value per each set of the multiple sets, based on values clustered into the set, to provide multiple set values;
selecting, for each data element, a selected set value, that is closest to a value of the data element, among the multiple set values; and
generating, for each data element, the CR of the data element, based on a difference between the data element and the selected set value;
generating compression metadata related to the CR of the data elements, wherein the compression metadata comprises the multiple set values and a mapping between the CR of each data element and the selected set value of the data element;
wherein the compressing further comprising:
evaluating multiple configurations, wherein each evaluated configuration of the multiple configurations includes evaluated multiple set values, wherein different evaluated multiple set values include different numbers of set values; wherein the evaluating includes calculating an estimated storage consumption of the data elements when applying each of the multiple configurations, wherein the estimated storage consumption includes: (i) an aggregated storage size consumed by mappings related to all CRs of the data elements, wherein a storage size consumed by each mapping depends on a number of set values of the evaluated configuration; (ii) a size of the evaluated multiple set values; and (iii) a total size of the CR of the data elements when applying the evaluated multiple set values;

and storing, in the TD, the CR of the data elements;

wherein the compute core comprises a processing circuit that comprises an integrated circuit.

12. The non-transitory computer readable medium according to claim 11, wherein the compressing comprises calculating different CR candidates of the data elements and selecting the CR of the data elements out of the different CR candidates.

13. The non-transitory computer readable medium according to claim 12, wherein at least two of the different CR candidates differ from each other by a set generation parameter defining a manner in which the multiple sets are defined.

14. The non-transitory computer readable medium according to claim 12, wherein at least two of the different CR candidates differ from each other by a set value calculation parameter defining a manner in which the multiple set values are calculated.

15. The non-transitory computer readable medium according to claim 12, wherein the set value calculation parameter defines a set value of a set as an average of values of the set.

16. The non-transitory computer readable medium according to claim 12, wherein the set value calculation parameter defines a set value of a set that is a cluster as a centroid of the cluster.

17. The non-transitory computer readable medium according to claim 11 that stores instructions for comparing a storage effectiveness of a storage of the data elements to a storage effectiveness of the CR of the data elements and the compression metadata.

18. The non-transitory computer readable medium according to claim 17 that stores instructions for storing one out of the (a) data elements, or (b) the CR of the data elements and the compression metadata, wherein the storing is based on an outcome of the comparing.

19. The non-transitory computer readable medium according to claim 11 wherein the clustering comprises sorting the data element values to provide sorted values, and dividing the sorted values to provide the multiple sets.

20. The non-transitory computer readable medium according to claim 19 wherein the clustering comprises determining sorted value gaps between consecutive sorted values, defining a predefined number of largest sorted gaps as inter-set gaps that separate between the multiple sets.

21. A processing core for compression of cells of a tabular database (TD), the processing core is configured to:

receive data elements, by a storage system;

compress the data elements to provide a compressed representation (CR) of the data elements by applying a compression process that comprises:

clustering values of the data elements into multiple sets;

associating a set value per each set of the multiple sets, based on values clustered into the set, to provide multiple set values;

selecting, for each data element, a selected set value, that is closest to a value of the data element, among the multiple set values; and generating, for each data element, the CR of the data element, based on a difference between the data element and the selected set value;

generating compression metadata related to the CR of the data elements, wherein the compression metadata comprises the multiple set values and a mapping between the CR of each data element and the selected set value of the data element;

wherein the compression process further comprising:

evaluating multiple configurations, wherein each evaluated configuration of the multiple configurations includes evaluated multiple set values, wherein different evaluated multiple set values include different numbers of set values; wherein the evaluating includes calculating an estimated storage consumption of the data elements when applying each of the multiple configurations, wherein the estimated storage consumption includes: (i) an aggregated storage size consumed by mappings related to all CRs of the data elements, wherein a storage size consumed by each mapping depends on a number of set values of the evaluated configuration; (ii) a size of the evaluated multiple set values; and (iii) a total size of the CR of the data elements when applying the evaluated multiple set values;

and trigger a storing, in the TD, the CR of the data elements;

wherein the compute core comprises a processing circuit that comprises an integrated circuit.

22. The method according to claim 1, wherein the method is executed tens times per second.

23. The method according to claim 1, wherein the compute node belongs to a group of computer nodes of the storage system that are in communication with each other and with storage nodes of the storage system via a network.

24. The method according to claim 8 wherein the comparing further takes into account at least one of additional latency or resources related to the compression of the data elements.

* * * * *